(12) United States Patent
Acosta et al.

(10) Patent No.: US 11,668,664 B2
(45) Date of Patent: Jun. 6, 2023

(54) DETECTION OF SOLID ORGANIC MATERIAL AND FLUIDS IN A SHALE ROCK BY MEANS OF LOW FIELD NMR

(71) Applicants: YPF TECNOLOGÍA S.A., Ciudad Autónoma de Buenos Aires (AR); CONSEJO NACIONAL DE INVESTIGACIONES CIENTÍFICAS Y TÉCNICAS (CONICET), Ciudad Autónoma de Buenos Aires (AR); UNIVERSIDAD NACIONAL DE CÓRDOBA, Ciudad de Córdoba (AR)

(72) Inventors: Rodolfo Hector Acosta, Córdoba (AR); Emilia Victoria Silletta, Córdoba (AR); Gustavo Alberto Monti, Córdoba (AR); Yamila Garro Linck, Alta Gracia (AR); Paula Cecilia Bedini, Hudson (AR); Gabriela Soledad Vila, La Plata (AR); Diana María Masiero, Ranelagh (AR); Esteban Alejo Domené, Ciudad Autónoma de Buenos Aires (AR); Manuel Isaac Velasco, Córdoba (AR)

(73) Assignees: YPF TECNOLOGIA S.A., Ciudad Autonoma de Buenos Aires (AR); CONSEJO NACIONAL DE INVESTIGACIONES CIENTIFICAS Y TECNICAS (CONICET), Ciudad Autonoma de Buenos Aires (AR); UNIVERSIDAD NACIONAL DE CORDOBA, Ciudad de Cordoba/Prov. de Cordoba (AR)

( * ) Notice: Subject to any disclaimer, the term of this patent is extended or adjusted under 35 U.S.C. 154(b) by 226 days.

(21) Appl. No.: 17/081,561

(22) Filed: Oct. 27, 2020

(65) Prior Publication Data
US 2021/0123874 A1   Apr. 29, 2021

Related U.S. Application Data

(60) Provisional application No. 62/927,383, filed on Oct. 29, 2019.

(51) Int. Cl.
*G01N 24/08* (2006.01)
*G01R 33/50* (2006.01)
*G01V 3/32* (2006.01)

(52) U.S. Cl.
CPC .......... *G01N 24/081* (2013.01); *G01R 33/50* (2013.01); *G01V 3/32* (2013.01)

(58) Field of Classification Search
CPC ......... G01N 24/081; G01R 33/50; G01V 3/32
See application file for complete search history.

(56) References Cited

U.S. PATENT DOCUMENTS

| | | | |
|---|---|---|---|
| 2015/0219782 A1* | 8/2015 | Kadayam Viswanathan | ............... G01V 3/38 324/309 |
| 2017/0212063 A1* | 7/2017 | Kantzas | ............... G01N 24/081 |
| 2020/0264331 A1* | 8/2020 | Venkataramanan | ..... G01V 3/38 |

* cited by examiner

*Primary Examiner* — Gregory H Curran
(74) *Attorney, Agent, or Firm* — Muncy, Geissler, Olds & Lowe, P.C.

(57) ABSTRACT

A method and device for detection of solid organic matter and fluids in a shale rock by means of low field Nuclear Magnetic Resonance (NMR) in a single measurement, by submitting a rock sample to a 2D NMR assay comprising applying a 2D pulse sequence with a saturation-recovery, or inversion-recovery, in an indirect dimension and an FID-CPMG in a direct dimension. The method can be used as an analytical technique for rock samples from unconventional hydrocarbon reservoirs.

19 Claims, 9 Drawing Sheets

DETECTION OF SOLID ORGANIC MATERIAL AND FLUIDS IN A SHALE ROCK BY MEANS OF LOW FIELD NMR

CROSS REFERENCE TO RELATED APPLICATIONS

This application this application claims priority of U.S. Provisional Application No. 62/927,383 filed on Oct. 29, 2019 under 35 U.S.C. § 119(e), the entire contents of all of which are hereby incorporated by reference.

FIELD OF THE INVENTION

The present invention relates to a method for the detection of solid organic matter and fluids in shale rocks by means of low field NMR (Nuclear Magnetic Resonance) in a single experiment. More particularly, the present invention relates to the use of a 2D pulse sequence that allows the detection of rapid decaying components in the Free Induction Decay (FID) period after the first 90° radiofrequency pulse of a Carr-Purcell-Meiboom-Gill (CPMG) pulse sequence, and fluid components during the interval between refocusing pulses in a CPMG in low-field NMR.

BACKGROUND OF THE INVENTION

NMR has turned into the standard method for the characterization of conventional reservoirs due to its non-invasive characteristics and the possibility of performing in situ measurements. Unlike conventional reservoirs, unconventional reservoirs are characterized by having ultra-low permeability, and consequently, standard methods do not provide accurate results. One of the most productive unconventional reservoir rocks are shales, which are reservoir rocks with a high amount of organic matter, that under high pressure and temperature can produce oil and gas. The organic matter and clay present in shales are rich in hydrogen and therefore contribute to the NMR signal. The components detected by NMR are mostly liquid hydrocarbons, gas, and water which, in general, present transverse relaxation times larger than 1 ms. It is crucial to evaluate and characterize shales in order to distinguish the signal coming from liquids, which constitute the dominant fraction of the producible fluid, defining the value of the well. Solid matter, kerogen, and bitumen have the typical fast decay of solids, with signals vanishing in the order of hundreds of microseconds. Their characterization is important to understand the impact on rock producibility. However, the accurate detection of these components is still a challenge and strongly depends on the hardware in use. The preferred magnetic field intensity in laboratory studies within the petrophysics community is 0.05 T, corresponding to a frequency of 2 MHz for $^1$H. This choice is made due to a combination of factors. On one hand, this field matches that used in well-logging tools. Additionally, the variation of magnetic susceptibilities across the sample induces a distribution of internal field gradients, which is mitigated with a reduction of the magnetic field.

The development of new methods and new NMR pulse sequences are the focus of intense study nowadays. Recently, Song and Kausik (*NMR application in unconventional shale reservoirs—A new porous media research frontier*, Progress in Nuclear Magnetic Resonance Spectroscopy 112-113 (2019) 17-33) have summarized the state of the art in terms of time-domain NMR applications in unconventional shale reservoirs. Two-dimensional (2D) $T_1$-$T_2$ correlation maps proved to be extremely useful in the analysis of complex systems, in particular shales. It has been shown that 2D NMR $T_1$-$T_2$ methods (where $T_1$ is the longitudinal relaxation time and $T_2$ is the transverse relaxation time) can enable the differentiation of bitumen and clay-bound water from the oil in the organic porosity and the fluids in the inorganic porosity (K. Washburn, J. Birdwell, *Updated methodology for nuclear magnetic resonance characterization of shales*, Journal of magnetic resonance 233C (2013) 17-28; and M.-F. Romero-Sarmiento, S. Ramiro-Ramirez, G. Berthe, M. Fleury, R. Littke, *Geochemical and petrophysical source rock characterization of the Vaca Muerta Formation, Argentina: Implications for unconventional petroleum resource estimations*, International Journal of Coal Geology 184 (2017) 27-41).

The standard NMR pulse sequence to acquire the $T_2$ decay in a $T_1$-$T_2$ correlation map is the Carr-Purcell-Meiboom-Gill (CPMG) pulse sequence, where the optimum echo time for this application is the shortest time possible in each equipment. In particular, the most common characteristic of the hardware operating at 2 MHz is that the minimum echo times are in the order of 120-200 μs. Since kerogen, bitumen, and bound oil and water in the organic pores have very short decay times, they fall outside the detection window. Therefore, the effort has been set in performing measurements with shorter echo times.

In order to obtain a $T_1$-$T_2$ map from the signals acquired, different approaches can be followed. A numerical inversion can be performed by using the adaptive truncation of matrix decomposition introduced by Teal and Eccles (P. D. Teal, C. Eccles, *Adaptive truncation of matrix decompositions and efficient estimation of NMR relaxation distributions*, Inverse Problems 31 (2015) 045010). Other algorithms are available for analyzing NMR data. For 1D experiments, the signal decay can be converted to a one-dimensional $T_2$ spectrum assuming multi-exponential decays. Some examples of these methods are the "Windows Processing" scheme disclosed by Freedman (U.S. Pat. No. 5,291,137) and the "Uniform Penalty" method (Borgia, G. C. Brown, R. J. S. and Fantazzini, P., J. Magn Reson. 132, 65-77, 1998). The method disclosed by Freedman (U.S. Pat. No. 5,486,762) analyzes measurements comprising multiple measurements with different wait-times.

Several algorithms have been published for 1D experiments, for example by (1) S. W. Provencher, *CONTIN: A General Purpose Constrained Regularization Program for Inverting Noisy Linear Algebraic and Integral Equations*, Comput. Phys. Commun. 27, 229 (1982); (2) G. C. Borgia, R. J. S. Brown, and P. Fantazzini, *Uniform-penalty Inversion of Multi-exponential Decay Data*, J. Magn. Reson. 132, 65 (1998); and (3) E. J. Fordham, A. Sezginer, and L. D. Hall, *Imaging Multiexponential Relaxation in the ($y$; $\log_e T_1$) Plane, with Application to Clay Filtration in Rock Cores*, J. Magn. Reson. Ser. A 113, 139 (1995). However, these algorithms may not always be easily extended to handle 2D data sets due to the huge requirement for computer memory.

U.S. Pat. No. 9,052,409 issued to Prange describes a Laplace inversion algorithm based on a Monte Carlo method to generate a large ensemble of samples that can all statistically fit the experimental data.

The magnetic field corresponding to 20 MHz has been suggested as an optimum for the acquisition of relaxation maps in shales (J. G. Seland, K. E. Washburn, H. W. Anthonsen, J. Krane, *Correlations between diffusion, internal magnetic field gradients, and transverse relaxation in porous systems containing oil and water*, Phys. Rev. E 70 (2004) 051305; and S. Khatibi, M. Ostadhassan, H. Xie, T.

Gentzis, B. Bubach, Z. Gan, H. Carvajal-Ortiz, *NMR relaxometry a new approach to detect geochemical properties of organic matter in tight shales*, Fuel 235 (2019) 167-177), as the echo time is reduced to values around 70 µs. With superconducting magnets at 400 MHz, the echo time can be further reduced down to 20 µs (R. Kausik, K. Fellah, L. Feng, G. Simpson, *High- and low-field NMR relaxometry and diffusometry of the Bakken petroleum system*, Society of Petrophysicists and Well-Log Analysts 58 (2017) 341-351). Besides the possibility of acquiring the solid components, the measurement at different frequencies is very useful as it provides fluid differentiation since $T_1$ changes notoriously. For instance, hydrocarbons and water will have different $T_1/T_2$ ratios depending on the magnetic field.

C. Rondeau-Mouro et al. (C. Rondeau-Mouro, R. Kovrlija, E. Van Steenberge, S. Moussaoui, *Two dimensional IR-FID-CPMG acquisition and adaptation of a maximum entropy reconstruction*, Journal of Magnetic Resonance 265 (2016) 16-24) reported that by acquiring the FID signal in two-dimensional time-domain NMR spectroscopy, it is possible to characterize mixtures or complex samples in a study of hydrated wheat starch.

According to the state of the art related to the characterization of shale rocks with low-field NMR (2 MHz), it has not been possible to acquire the (fast) relaxation signal of a solid organic matter (kerogen), while the bitumen signal is only partially detectable (see Song and Kausik ibic).

The oil & gas industry is in constant need of improved methods for the detection of solid organic matter and fluids in oil and gas unconventional reservoirs. In particular, there is a need for novel methods that overcome the above-mentioned limitation. It is possible to carry out an analysis based on pyrolysis or combustion-based techniques, but these methods are time-consuming and destructive to the sample. Alternatively, nondestructive NMR measurements allow the detection of signals with short decay times that provide an estimate of the total organic carbon (TOC) content, while the long-time decay provides a quantification of the liquid and/or gas content in the rocks micropores.

BRIEF DESCRIPTION OF INVENTION

The present inventors focused on the acquisition of solid components in shales by combining the traditional CPMG scheme, which senses the long-time decay, with the acquisition of fast-decaying signals in the FID (Free Induction Decay), that is, acquiring both FID and CPMG in a single experiment. Therefore, the present invention provides a novel 2D pulse sequence and detection method where FID-CPMG detection is applied to shales, where both organic solid-like and liquid components are present. The novel application of the aforementioned 2D pulse sequence and variations in the indirect dimension ($T_1$) encoding, or a variation in the detection period, which involves monitoring an FID and the NMR signal evolution during the train of refocusing pulses provided by the present invention, allows overcoming the limitation in the state of the art cited above. This includes the detection of the FID after the application of a dipolar or magic sandwich echo that is applied following the $T_1$ encoding period; or the use of a spin-echo generation after the FID detection and prior to the train of refocusing pulses (FID-ECHO-CPMG); or, in general, any variation that involves the acquisition of an FID and CPMG in a single experiment applied to unconventional hydrocarbon reservoirs.

Therefore, in a first aspect, the present invention provides a method for the detection of solid organic matter and fluids in a shale rock by means of low field NMR (Nuclear Magnetic Resonance) in a single measurement. The method comprises the following steps:

i) providing a rock sample;
ii) submitting the sample to a 2D Nuclear Magnetic Resonance (NMR) assay comprising the application of a 2D pulse sequence with a saturation-recovery, or inversion-recovery, in an indirect dimension and an FID-CPMG in a direct dimension;
iii) obtaining a 2D $T_1$-$T_2$ map from the NMR assay, preferably by applying a 2D numerical inversion algorithm;
iv) determining relaxation times;
v) assigning solid organic matter and fluid contributions based on the relaxation times;
vi) quantifying the amount of $^1$H nuclei in predefined regions in the 2D map by using a pre-calibration of an equipment response.

In preferred embodiments of the present invention, the sample rock is selected from the group comprising tight gas sandstones, oil or tar sands, heavy oil, gas shales, coalbed methane, oil shales, gas hydrates, shale gas, shale oil, other low-permeability tight formations, solid bitumen and extracted organic matter. Preferably, the rock sample is in a form selected from a cylindrical plug of various dimensions, a sidewall core, drill cuttings, or ground rock.

In a preferred embodiment of the present invention, in step ii) the detection period is replaced by a dipolar refocusing pulse sequence such as dipolar echo or magic sandwich echo followed by a train of 180° refocusing radiofrequency pulses. More preferably, in step ii) a dipolar refocusing pulse sequence such as dipolar echo or magic sandwich echo is applied prior to the FID-CPMG in the direct dimension.

In an embodiment of the present invention, solid organic matter is assigned transverse relaxation times shorter than approximately 200 microseconds.

In another embodiment of the present invention, fluids are assigned transverse relaxation times longer than approximately 200 microseconds.

In an embodiment of the present invention, the pre-calibration of step vi) is carried out using a calibration sample, such as a known volume of water or water doped with $CuSO_4$, with a transverse relaxation time in the order of 100 ms.

In a preferred embodiment of the present invention, an NMR equipment with magnetic field strength corresponding to a $^1$H resonance frequency of 1.5 MHz to 60 MHz is used.

In a more preferred embodiment of the present invention, the NMR equipment is a laboratory instrument or a well-logging tool, either at low or high field.

In still a preferred embodiment of the present invention, a receiver has a dead time shorter than 50 µs, achieved by using an active resonant circuit Q-factor modulation. Preferably, the method is carried out using a NMR laboratory or a well-logging tool, either at low or high field.

A preferred variation of the hardware, when the receiver conditions above mentioned are not met, is to reduce the dead time in the pulse sequence in order to acquire part of the resonant circuit ringing up to the voltage required to safely use the systems preamplifier. In this embodiment, an auxiliary experiment is performed to map the response of the resonant circuit to the input of an RF pulse. These data are subtracted in a point-by-point fashion from the data acquired with the presence of the sample under study, in a postprocessing step.

An alternative preferred variation of the reduction of the dead time consists in the introduction of an attenuator in a switchable circuit that enables the attenuation of the signal induced in the resonance circuit after the first radiofrequency pulse of the FID excitation pulse, and the removal of the attenuator during the CPMG pulse sequence application. In this embodiment, an auxiliary experiment is performed to map the response of the resonant circuit to the input of an RF pulse. These data are subtracted in a point-by-point fashion from the data acquired with the presence of the sample under study, in a postprocessing step.

In preferred embodiments of the present invention, the method comprises variable data acquisition time, or dwell time, and the use of programmable digital filters or analog filters.

In another preferred embodiment of the present invention, the method further allows the characterization of the total organic content of the sample.

In a more preferred embodiment of the present invention, the method further comprises the steps of:
acquiring the decay after a Hahn Echo following the first FID decay; or
acquiring the decay of the FID and CPMG in any other single experiment.

In a second aspect, the present invention provides a device for detecting solid organic matter and fluids in a shale rock, the device comprising:
a. an NMR equipment configured to:
perform a 2D NMR assay comprising the use of a 2D pulse sequence with a saturation-recovery, or inversion-recovery, in an indirect dimension and an FID-CPMG in a direct dimension;
obtain a 2D $T_1$-$T_2$ map from the NMR assay by using a two-dimensional numerical inversion algorithm; and
b. processing means configured to analyze data from the 2D $T_1$-$T_2$ map in order to:
assign solid and fluid contributions based on relaxation times; and
quantify the amount of $^1H$ nuclei in predefined regions in the 2D map by using a pre-calibration of the equipment response.

In an embodiment of the second aspect of the invention, the NMR equipment is an instrument with magnetic field strength corresponding to a $^1H$ resonance frequency of 1.5 MHz to 60 MHz.

In another preferred embodiment of the second aspect of the invention, the NMR equipment has a receiver dead time shorter than 50 µs with an active resonant circuit Q-factor modulation. Preferably, the NMR equipment is a laboratory instrument or a well-logging tool, either at low or high field.

In another preferred embodiment of the second aspect of the invention, the pre-calibration of the response is done using a calibration sample, such as a known volume of water or water doped with $CuSO_4$, with a transverse relaxation time in the order of 100 ms.

DETAILED DESCRIPTION OF THE INVENTION

Applying the 2D pulse sequences of the present invention, the organic matter contained in shale rock can be detected and quantified in the laboratory with low-field NMR in cores, plugs, sidewall cores, drill cuttings, and ground rock. The same sequence could be programmed in the NMR well-logging tool in order to detect the signal of organic matter in a well profile.

The present invention will be described in detail on the basis of the following examples and in relation to the appended figures, which illustrate preferred embodiments of the invention.

Two rock samples (plugs extracted from a core) corresponding to the oil window in the Vaca Muerta Formation in Argentina were designated as Shale #1 and Shale #2. Shale #3 is an outcrop sample from the Vaca Muerta Formation. The rocks were measured as-received.

Shale #1 has a TOC of 4.34 wt % as calculated from a Rock-Eval 6 pyrolysis experiment.

Shale #2 has a TOC of 4.59 wt % as calculated from a Rock-Eval 6 pyrolysis experiment.

Shale #3 has a TOC of 10.4 wt % as calculated from a Rock-Eval 6 pyrolysis experiment.

Figure 1A:
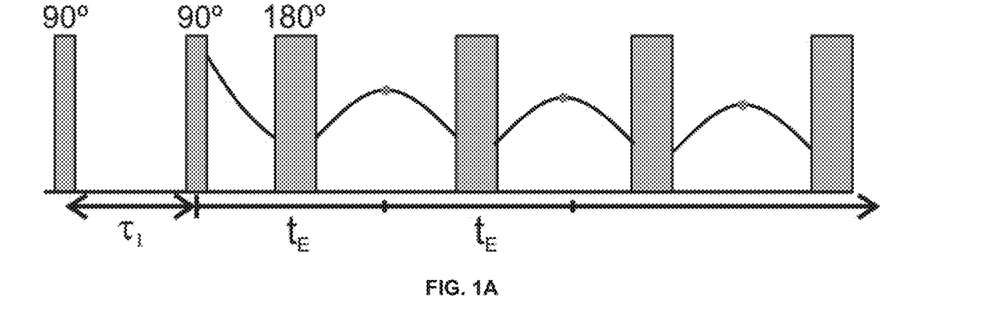
FIG. 1A shows a diagram of the standard SR-CPMG pulse sequence to acquire a $T_1$-$T_2$ map using saturation recovery (SR) for $T_1$ encoding and acquiring a CPMG for $T_2$. The dots represent the acquired data.

The NMR experiments at 2.2 MHz for $^1$H were carried out in an Oxford Geospec2 instrument. The data for establishing a correlation of longitudinal and transverse relaxation times were acquired with saturation recovery (SR) to encode $T_1$ varying the delay ($\tau_1$) from 21 µs to 390 ms in 50 logarithmically spaced steps. In the experimental setup, SR showed a better performance than the original Inversion-Recovery (IR) presented by Rondeau-Mouro et al. (ibid). The pulse durations are 9 µs and 18 µs for the 90° and 180° pulses, respectively. The $T_2$ acquisition was done with different configurations:

In FIG. 1A, a SR-CPMG pulse sequence is used with an echo time $t_E$=200 µs and 500 echoes. Each datum was acquired at the top of the spin-echo, as schematized in the figure.

Figure 1B:
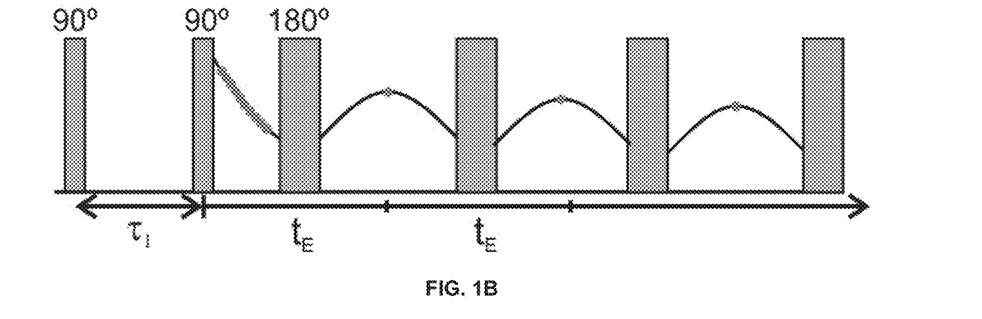
FIG. 1B shows a diagram of the proposed SR-FID-CPMG sequence which consists of a $T_1$-$T_2$ pulse sequence where the FID decay is also acquired to obtain the contribution of the fast-decaying components. The dots represent the acquired data.

In a second configuration, FIG. 1B, a SR-FID-CPMG pulse sequence was used. The CPMG is acquired with the parameters specified before, and the FID decay was acquired with a dwell time DW=8 µs. For the dwell time chosen, the dead time is 33 µs and 5 points can be acquired before the first 180° pulse, as schematized in the figure.

Figure 1C:
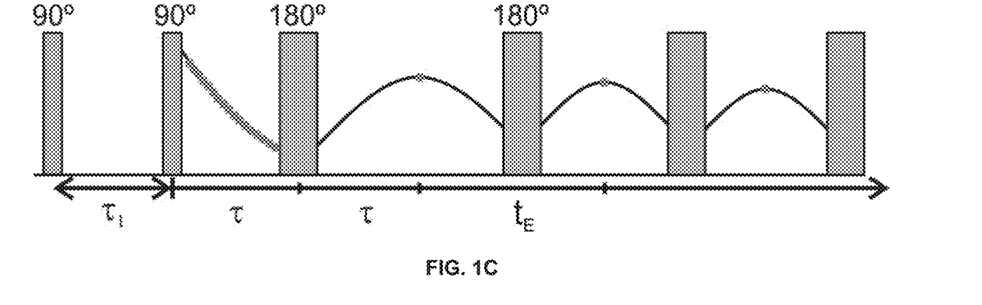
FIG. 1C shows a diagram of the proposed SR-FID-ECHO-CPMG sequence which consists of a $T_1$-$T_2$ pulse sequence where the Hahn Echo is also acquired after the FID decay to obtain the contribution of fast-decaying components. The dots represent the acquired data.

In order to acquire more data points during the FID decay, a SR-FID-ECHO-CPMG pulse sequence was implemented, see FIG. 1C. For this configuration, 18 points were acquired in the first FID with a total decay time of $\tau$=200 s and the CPMG was acquired with the same parameters as specified before.

The numerical inversion was performed by using the adaptive truncation of matrix decomposition introduced by Teal and Eccles (P. D. Teal, C. Eccles, *Adaptive truncation of matrix decompositions and efficient estimation of NMR relaxation distributions*, Inverse Problems 31 (2015) 045010). However, there are other methods that can be used to invert the data as specified above.

Figure 2A:
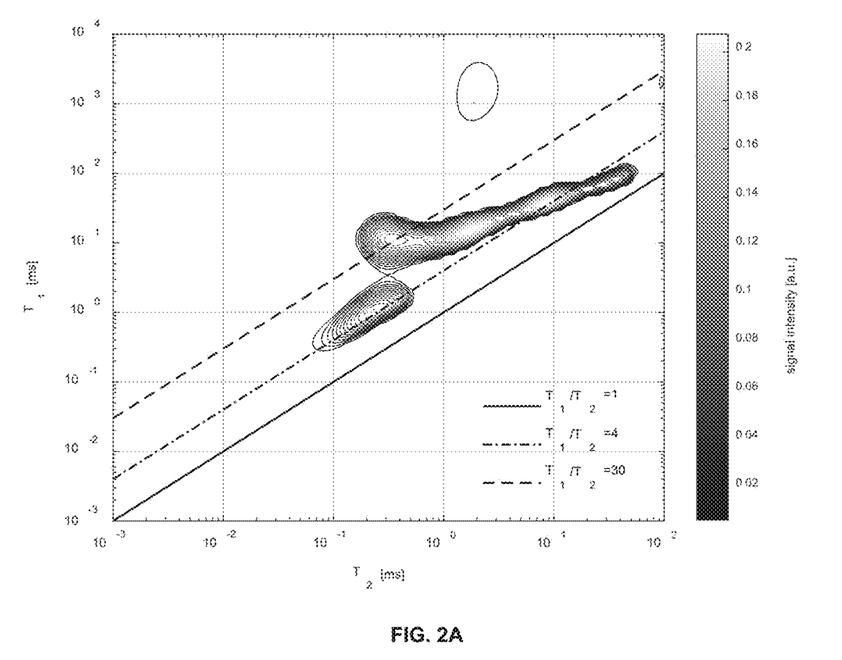
FIG. 2A shows an NMR (2.2 MHz) 2D $T_1$-$T_2$ map of the as-received core plug sample Shale #1 using an SR-CPMG.
Figure 2B:
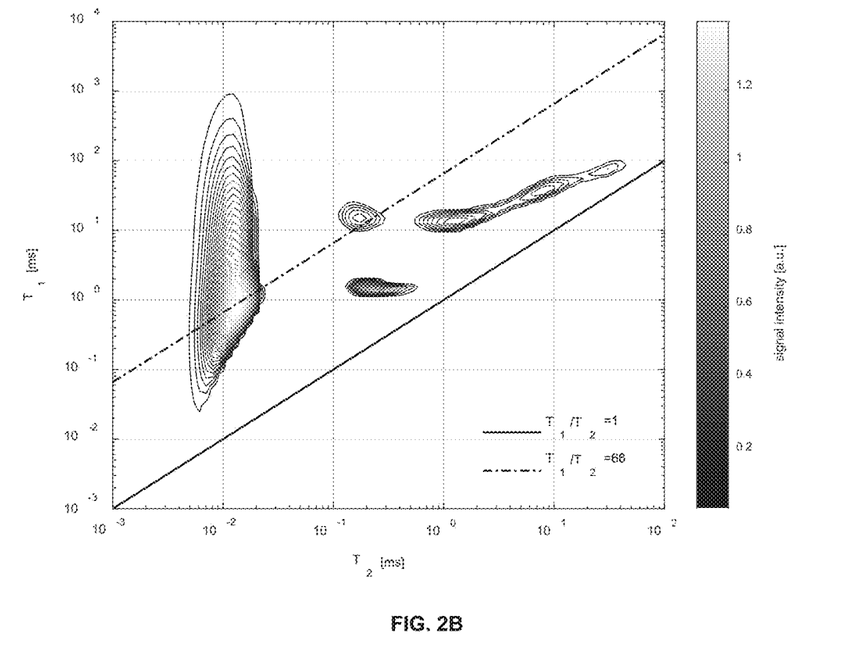
FIG. 2B shows an NMR (2.2 MHz) 2D $T_1$-$T_2$ map of the as-received core plug sample Shale #1 using an SR-FID-CPMG.
Figure 2C:
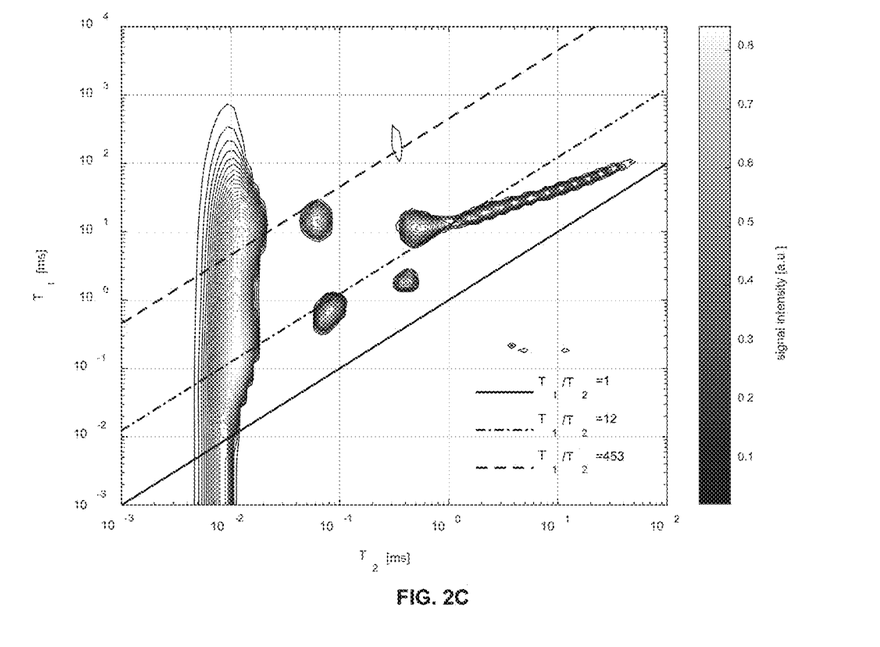
FIG. 2C shows an NMR (2.2 MHz) 2D $T_1$-$T_2$ map of the as-received core plug sample Shale #1 using an SR-FID-ECHO-CPMG.

FIG. 2A shows the 2D $T_{10}$-$T_2$ map for Shale #1, as-received, using a CPMG pulse sequence for detection (FIG. 1A). Due to the echo time used ($t_E$=200 µs), only the water and light oil (not heavy) present in both organic and inorganic pores contribute to the signal. However, the signal coming from solid components decays faster and those contributions do not show in the $T_1$-$T_2$ correlation map. In order to acquire these signals, the FID decay is also measured in the same experiment, as schematically shown in FIG. 1B. In FIG. 2B a component with $T_2$=15 µs is present, which does not appear with the traditional approach that uses only the long echo time available in low field laboratory instruments and well-logging tools. The contribution which appears within $T_1/T_2$=4-100 agrees with what is disclosed by R. Kausik et al. (R. Kausik, K. Fellah, E. Rylander, P. Singer, R. Lewis, S. Sinclair, *NMR relaxometry in shale and implications for logging*, PETROPHYSICS 57 (2016) 339-350) as the signal from bitumen. Unexpectedly, an extra contribution was observed above $T_1/T_2$=100. According to R. Kausik et al., this signal with the shortest $T_2$ and high $T_1$, is correlated to kerogen. By acquiring the FID-CPMG decay, the instrumental limitation is therefore overcome. In FIG. 2C, an FID-ECHO-CPMG was used for $T_2$ acquisition. The signal correlated to kerogen appears about a ratio $T_1/T_2$=450.

Figure 3A:
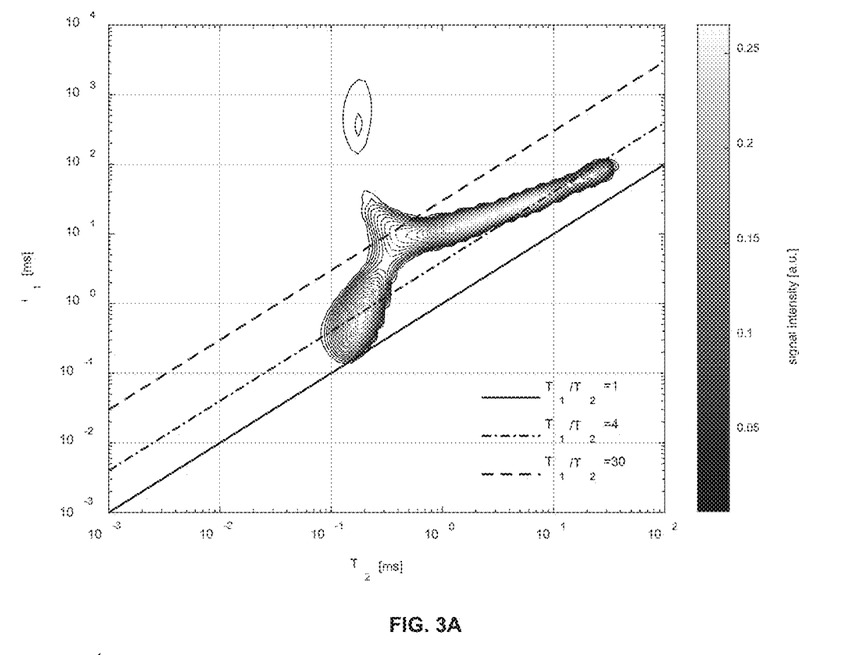
FIG. 3A shows an NMR (2.2 MHz) 2D $T_1$-$T_2$ map of the as-received core plug sample Shale #2 using an SR-CPMG.
Figure 3B:
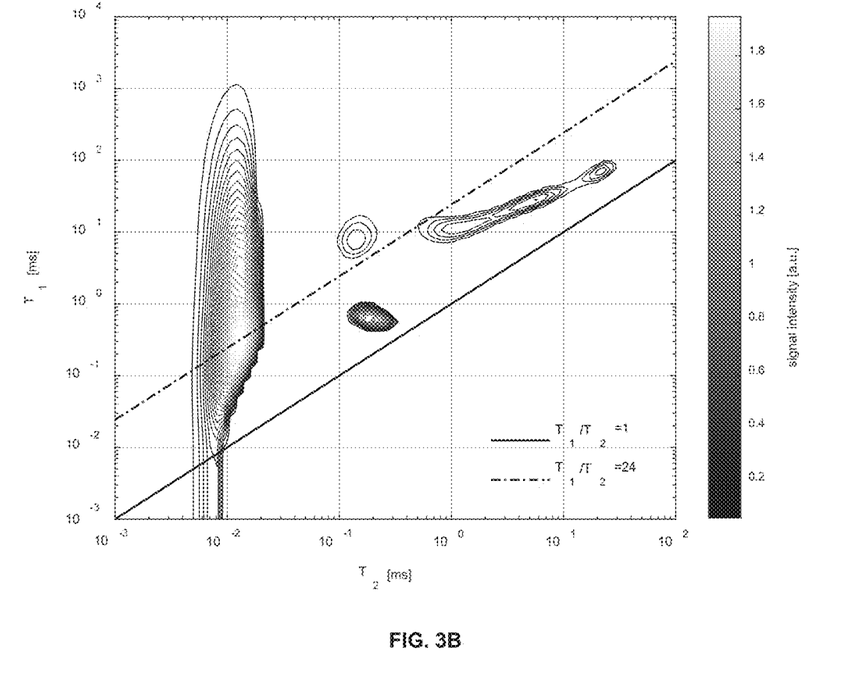
FIG. 3B shows an NMR (2.2 MHz) 2D $T_1$-$T_2$ map of the as-received core plug sample Shale #2 using an SR-FID-CPMG.
Figure 3C:
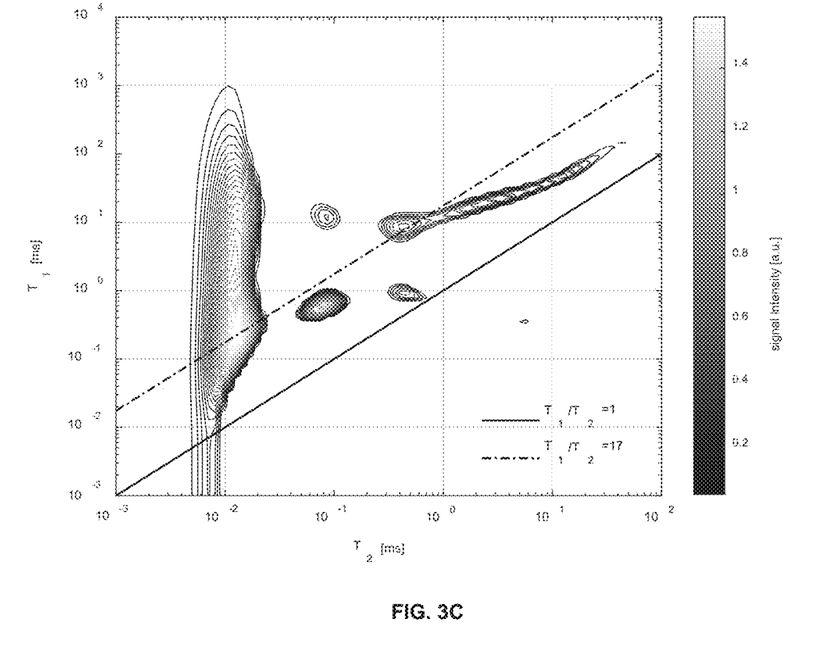
FIG. 3C shows an NMR (2.2 MHz) 2D $T_1$-$T_2$ map of the as-received core plug sample Shale #2 using an SR-FID-ECHO-CPMG.

The same experiments were carried out for a second sample (Shale #2) where a similar result was found, see FIGS. 3A to 3C. The signal correlated to kerogen appears above $T_1/T_2$=100 for Shale #2.

Figure 3D:
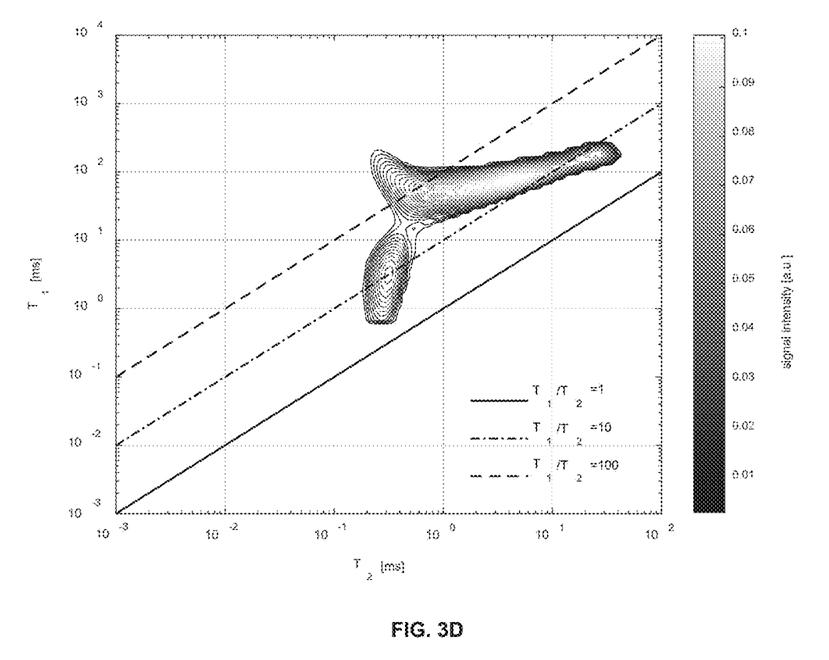
FIG. 3D shows an NMR (19.9 MHz) 2D $T_1$-$T_2$ map of the as-received core plug sample Shale #2 using an SR-CPMG.
Figure 3E:
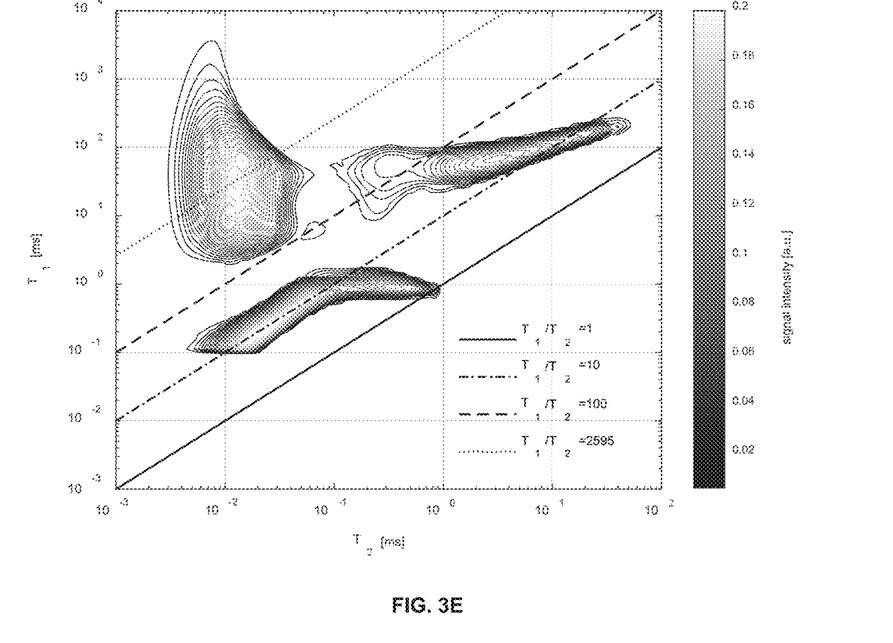
FIG. 3E shows an NMR (19.9 MHz) 2D $T_1$-$T_2$ map of the as-received core plug sample Shale #2 using an SR-FID-CPMG.
Figure 4A:
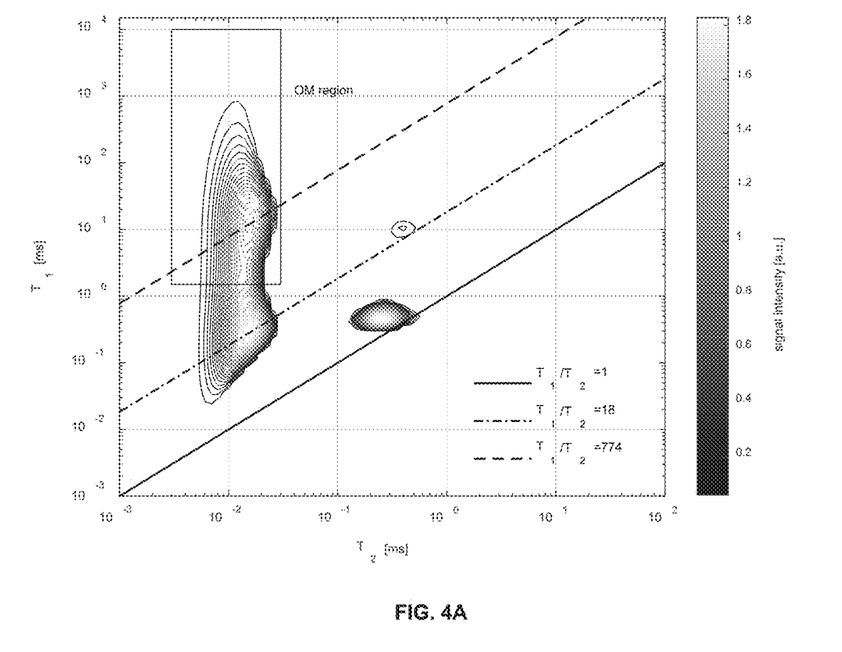
FIG. 4A shows an NMR (2.2 MHz) 2D $T_1$-$T_2$ map of the as-received outcrop sample Shale #3 using an SR-FID-CPMG.
Figure 4B:
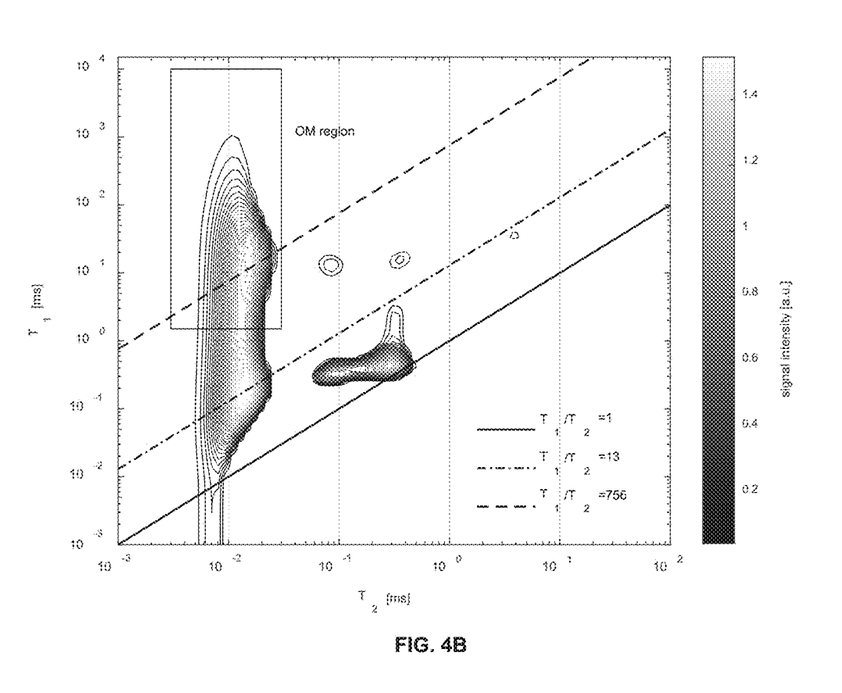
FIG. 4B shows an NMR (2.2 MHz) 2D $T_1$-$T_2$ map of the as-received outcrop sample Shale #3 using an SR-FID-ECHO-CPMG.

The same experiments using an SR-FID-CPMG and an SR-FID-ECHO-CPMG pulse sequence were carried out for a third sample (Shale #3) where still a similar result was found, see FIGS. 4A and 4B. The signal correlated to kerogen appears around the ratio $T_1/T_2$=750-770 for Shale #3. NMR experiments at 19.9 MHz were also carried out for Shale #2, see FIGS. 3D and 3E.

The NMR experiments at 19.9 MHz were performed in a Bruker Minispec MQ20 Time-Domain Spectrometer, equipped with permanent magnets that provide an operating magnetic field of ca. 0.5 T. The correlation of longitudinal and transverse relaxation times was acquired with saturation recovery (SR) to encode $T_1$ varying the delay ($\tau_1$) from 25 µs to 1500 ms in 50 logarithmically spaced steps. The pulse durations are 4 µs and 8 µs for the 90° and 180° pulses, respectively. The $T_2$ acquisition was done with different configurations:

In FIG. 3D, a SR-CPMG pulse sequence is used with an echo time $t_E$=100 µs and 1000 echoes.

In a second configuration, that corresponds to FIG. 3E, a SR-FID-CPMG pulse sequence was used. The CPMG is acquired with the parameters specified before, and the FID decay was acquired with 80 points and a dwell time DW=0.6 µs. The dead time is 14 µs.

Figure 4C:
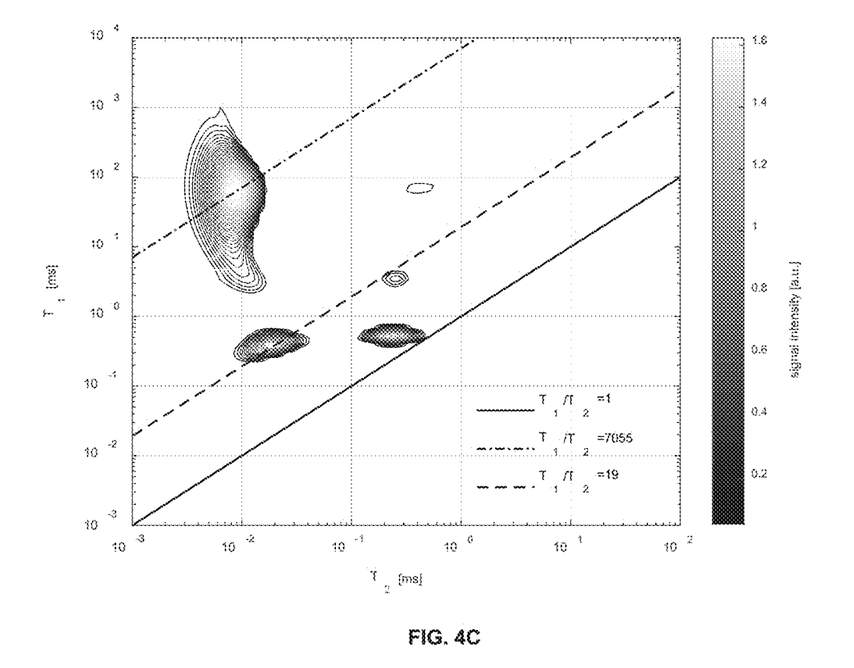
FIG. 4C shows an NMR (19.9 MHz) 2D $T_1$-$T_2$ map of the as-received outcrop sample Shale #3 using an SR-FID-CPMG.
Figure 4D:
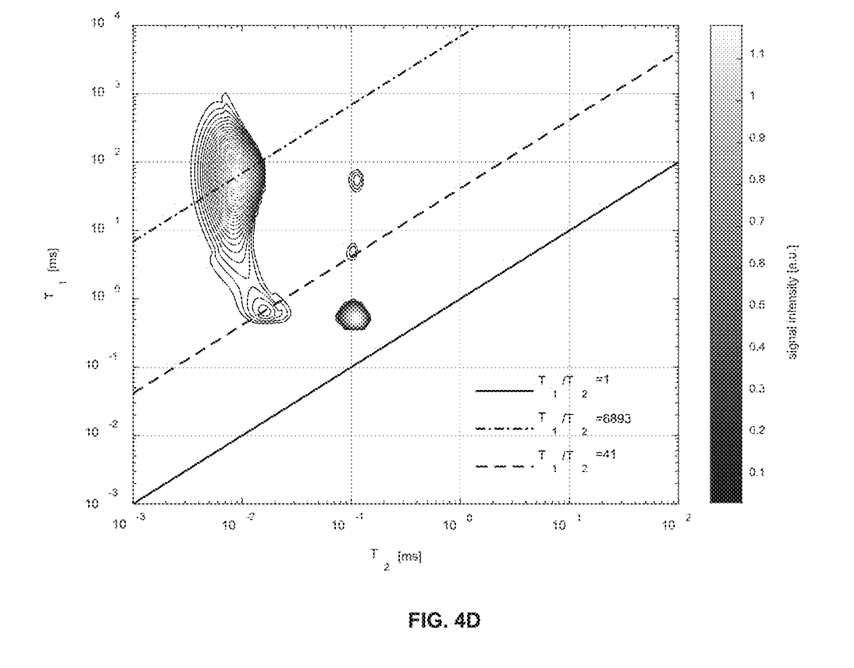
FIG. 4D shows an NMR (19.9 MHz) 2D $T_1$-$T_2$ map of the as-received outcrop sample Shale #3 using an SR-FID.

For shales collected from outcrop zones (Shale #3), the amount of fluid is negligible, and mainly organic matter and clay bound water are present. They have a rapid signal decay that can be acquired with a complete FID. The limitation is that the longest relaxation time must be shorter than the $T_2$* of the equipment, which is of 1.4 ms for the used Bruker Minispec MQ20. For this kind of samples, it is sufficient to acquire an SR-FID sequence with the same list for $\tau_1$ and acquisition of 10000 points with DW=0.4 µs (M. Sadegh Zimiri, B. MacMillan, F. Marica, J. Guo, L. Romero-Zerón, B. J. Balcom, *Petrophysical and geochemical evaluation of shales using magnetic resonance $T_1$-$T_2$* relaxation correlation*, Fuel 284 (2021) 119014). This is shown in FIG. 4D. A comparison can be made with a SR-FID-CPMG for the same sample (FIG. 4C).

The total organic carbon was obtained by Rock-Eval 6 pyrolysis for the as-received samples Shale #1, Shale #2, and Shale #3. The same procedure was performed for the other 28 as-received samples from the same outcrop as Shale #3.

Figure 5A:
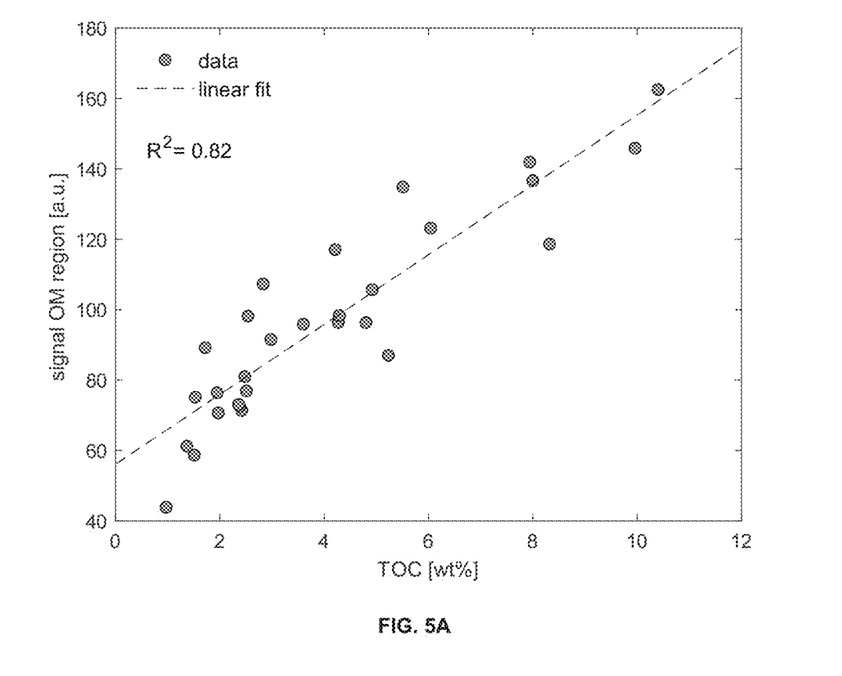
FIG. 5A shows the total signal per unit sample mass in the region labeled as "OM region" in the NMR (2.2 MHz) 2D $T_1$-$T_2$ map in FIG. 4A, as a function of TOC, for Shale #3 and twenty-eight other as-received samples from the same outcrop. An FID-CPMG was used for the $T_2$ acquisition and a saturation recovery was used for $T_1$ encoding. $R^2$ stands for the coefficient of determination of the least squares linear regression represented by the dashed line.
Figure 5B:
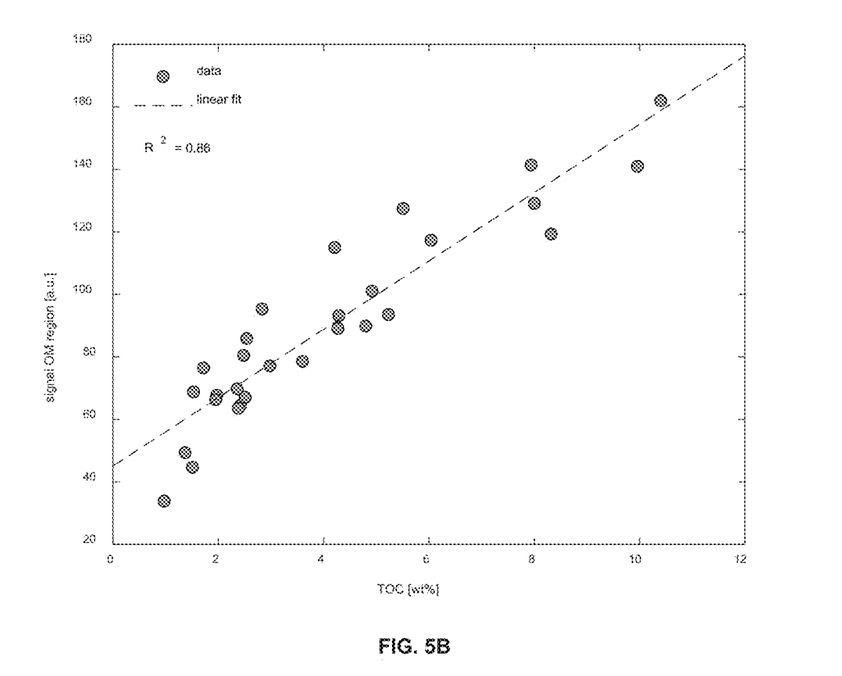
FIG. 5B shows the total signal per unit sample mass in the region labeled as "OM region" in the NMR (2.2 MHz) 2D $T_1$-$T_2$ map in FIG. 4B, as a function of TOC, for Shale #3 and twenty-eight other as-received samples from the same outcrop. An FID-ECHO-CPMG was used for the $T_2$ acquisition and a saturation recovery was used for $T_1$ encoding. $R^2$ stands for the coefficient of determination of the least squares linear regression represented by the dashed line.

The TOC values for the 29 outcrop samples mentioned above strongly correlate with the total signal per unit mass in the region in the NMR (2.2 MHz) $T_1$-$T_2$ map defined by $3 \cdot 10^{-3}$ ms<$T_2$<$3 \cdot 10^{-2}$ ms and 1.5 ms<$T_1$<$10^4$ ms and labeled as "OM region" in FIGS. 4A and 4B. This positive correlation is found both when the NMR (2.2 MHz) $T_1$-$T_2$ map is acquired with either an SR-FID-CPMG or an SR-FID-ECHO-CPMG experiment, as shown in FIGS. 5A and 5B, respectively.

The strategy of acquiring the already available magnetization after the first radiofrequency pulse is a great step towards the accurate characterization that will allow further developments, like the extension of the FID acquisition period by introducing a Hahn echo followed by a CPMG sequence. An alternative consists in the elimination of the blind window at short times due to the receiver dead time by using dipolar refocusing sequences such as those used to correlate short time signals with total organic carbon content.

The present invention has demonstrated that the contribution of components with short relaxation times in unconventional reservoir rocks can be observed at low fields using the existing NMR instruments. By measuring $T_1$-$T_2$ maps with the acquisition of an SR-FID-CPMG or an SR-FID-ECHO-CPMG experiment, signals coming from environments with relaxation time shorter than the echo time can also be sensed. This methodology uses standard low field NMR instruments applying a new acquisition sequence, with no need for additional complements.

It is to be understood that the above description is intended to be illustrative and not restrictive. Many embodiments will be apparent to those skilled in the art upon reviewing the above description. The scope of the invention should therefore, be determined not with reference to the above description, but should instead be determined with reference to the appended claims, along with the full scope of equivalents to which such claims are entitled. Those skilled in the art will recognize, or will be able to ascertain using no more than routine experimentation, many equivalents to the specific embodiments of the invention described. Such equivalents are intended to be encompassed by the following claims.

The invention claimed is:

1. A method for detection of solid organic matter and fluids in a geological formation sample by means of low field NMR (Nuclear Magnetic Resonance) in a single measurement, the method comprising the steps of:
   i. providing a rock sample;
   ii. submitting the sample to a 2D Nuclear Magnetic Resonance (NMR) assay comprising the application of a 2D pulse sequence with a saturation-recovery, or inversion-recovery, in an indirect dimension and a FID-CPMG in a direct dimension;
   iii. obtaining a 2D $T_1$-$T_2$ map from the NMR assay;
   iv. determining relaxation times;
   v. assigning solid organic matter and fluid contributions based on the relaxation times, wherein solid organic matter is assigned transverse relaxation times shorter than approximately 200 microseconds;
   vi. quantifying the amount of $^1$H nuclei in predefined regions in the 2D map by using a pre-calibration of an equipment response.

2. The method of claim 1, wherein the 2D $T_1$-$T_2$ map is obtained by applying a 2D numerical inversion algorithm.

3. The method of claim 1, wherein the rock sample is selected from tight gas sandstones, oil or tar sands, heavy oil, gas shales, coalbed methane, oil shales, gas hydrates, shale gas, shale oil, other low-permeability tight formations, solid bitumen and extracted organic matter.

4. The method of claim 1, wherein the rock sample is in a form selected from a cylindrical plug of various dimensions, a sidewall core, drill cuttings, or ground rock.

5. The method of claim 1, wherein in step ii) a dipolar refocusing pulse sequence such as dipolar echo or magic sandwich echo is applied prior to the FID-CPMG in the direct dimension.

6. The method of claim 1, wherein in step v) fluids are assigned transverse relaxation times longer than approximately 200 microseconds.

7. The method of claim 1, wherein the pre-calibration of step vi) is carried out using a calibration sample, such as a known volume of water or water doped with $CuSO_4$, with a transverse relaxation time in the order of 100 ms.

8. The method of claim 1, wherein the method is carried out by using an NMR equipment with magnetic field strength corresponding to a $^1$H resonance frequency of 1.5 MHz to 60 MHz.

9. The method of claim 1, wherein a receiver dead time is shorter than 50 µs and preferably with an active resonant circuit Q-factor modulation.

10. The method of claim 1, further comprising a variable data acquisition time, or dwell time, and using programmable digital filters or analog filters.

11. The method of claim 1, further comprising characterizing the total organic content of the sample.

12. The method of claim 1, further comprising the steps of:
   acquiring the decay after a Hahn Echo following the first FID decay; or
   acquiring the decay of the FID and CPMG in any other single experiment.

13. The method of claim 1, wherein the method is carried out using a NMR laboratory or a well-logging tool, either at low or high field.

14. The method of claim 9, wherein the method is carried out using a NMR laboratory or a well-logging tool, either at low or high field.

15. A device for detecting solid organic matter and fluids in a shale rock, the device comprising:
   a. an NMR equipment configured to:
      perform a 2D NMR assay comprising the use of a 2D pulse sequence with a saturation-recovery, or inversion-recovery, in an indirect dimension and an FID-CPMG in a direct dimension;
      obtain a 2D $T_1$-$T_2$ map from the NMR assay by using a two-dimensional numerical inversion algorithm; and
   b. processing means configured to analyze data from the 2D $T_1$-$T_2$ map in order to:
      assign solid and fluid contributions based on relaxation times, wherein solid organic matter is assigned transverse relaxation times shorter than approximately 200 microseconds; and
      quantify the amount of $^1$H nuclei in predefined regions in the 2D map by using a pre-calibration of the equipment response.

16. The device of claim 15, wherein the NMR equipment is an instrument with magnetic field strength corresponding to a $^1$H resonance frequency of 1.5 MHz to 60 MHz.

17. The device of claim 15, wherein the NMR equipment is a laboratory instrument or a well-logging tool, either at low or high field.

18. The device of claim 15, wherein the NMR equipment has a receiver dead time shorter than 50 µs with active resonant circuit Q-factor modulation.

19. The device of claim 15, wherein the pre-calibration of the response is done using a sample with a known volume of water or water doped with $CuSO_4$ with a transverse relaxation time in the order of 100 ms.

* * * * *